US012730490B2

(12) United States Patent
Mosalikanti et al.

(10) Patent No.: US 12,730,490 B2
(45) Date of Patent: Sep. 8, 2026

(54) POWER REGULATION CIRCUIT FOR DROOP MITIGATION IN A POWER SOURCE VOLTAGE THAT POWERS A PROCESSING CORE

(71) Applicant: Intel Corporation, Santa Clara, CA (US)

(72) Inventors: Praveen Mosalikanti, Portland, OR (US); Robert Mongrain, Phoenix, AZ (US); Xingjian Cai, San Jose, CA (US); Yihong Yang, Portland, OR (US); Long Wang, El Dorado Hills, CA (US)

(73) Assignee: Intel Corporation, Santa Clara, CA (US)

(*) Notice: Subject to any disclaimer, the term of this patent is extended or adjusted under 35 U.S.C. 154(b) by 156 days.

(21) Appl. No.: 17/939,772

(22) Filed: Sep. 7, 2022

(65) Prior Publication Data

US 2024/0077924 A1 Mar. 7, 2024

(51) Int. Cl.

| | |
|---|---|
| ***G06F 1/28*** | (2006.01) |
| ***G01R 19/165*** | (2006.01) |
| ***G06F 1/3228*** | (2019.01) |
| ***H02J 7/80*** | (2026.01) |

(52) U.S. Cl.

CPC ......... *G06F 1/28* (2013.01); *G01R 19/16552* (2013.01); *G06F 1/3228* (2013.01); *H02J 7/80* (2026.01)

(58) Field of Classification Search

CPC ... G06F 1/28; G06F 1/3238; G01R 19/16552; H02J 7/80; H02J 7/0047

See application file for complete search history.

(56) References Cited

U.S. PATENT DOCUMENTS

| | | | | |
|---|---|---|---|---|
| 10,348,281 | B1 * | 7/2019 | Oliver | H03K 19/00369 |
| 2019/0317546 | A1 * | 10/2019 | Born | G06F 1/08 |

* cited by examiner

*Primary Examiner* — Stephanie E Bloss
*Assistant Examiner* — Michael A Harrison
(74) *Attorney, Agent, or Firm* — NICHOLSON DE VOS WEBSTER & ELLIOTT LLP

(57) ABSTRACT

Embodiments of a power regulation circuit that ameliorates a first and second droop in a power source voltage that powers a processing core are disclosed. The power regulation circuit includes a first droop detector, a second droop detector and a frequency slowdown detection circuit. The first droop detector generates a first droop detection signal in a first detection state in response to detecting a first droop in the power source voltage. The second droop detector generates a second droop detection signal in a second detection state in response to detecting a second droop in the power source voltage. The frequency slowdown detection circuit to generate a frequency slowdown signal in a slowdown state in response to at least one of the first droop detection signal being in the first detection state and the second droop detection signal being in the second detection state.

18 Claims, 14 Drawing Sheets

POWER REGULATION CIRCUIT FOR DROOP MITIGATION IN A POWER SOURCE VOLTAGE THAT POWERS A PROCESSING CORE

FIELD

Embodiments herein generally relate to the field of electronic circuits, and more specifically to power regulation circuits for droop mitigation.

BACKGROUND

Processing cores are powered by power source voltages that are directly or indirectly generated by a power supply. However, changes in the impedance seen by a power rail line carrying the power source voltage can result in droops in the power source voltage. This is the result of increases in impedance seen in higher frequency ranges. For example, power supply voltage can experience a first droop followed by a second droop. The first droop is caused by an increase in impedance in the Reducing the impedance of load line (LL) by populating capacitors on corresponding power rails or adding more copper layers on package and board is the previous solution for reducing 2nd droop magnitudes to facilitate computing performance gain generation over generation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Embodiments of a power regulation circuit that powers a processing core are disclosed. The power regulation circuit is capable of detecting a first droop and a second droop that follows the second droop in a power source voltage. In some embodiments, the first droop in the power source voltage occurs in a frequency range that is higher than a frequency range of the second droop. The power regulation circuit includes a first droop detector that detects the first droop. In some embodiments, the first droop detector includes a high pass filter to pass the first droop for the purposes of detection. The power regulation circuit includes a second droop detector that detects the second droop. In some embodiments, the droop detector includes a bandpass filter to pass the second droop for the purposes of detection.

The first droop detector generates a first droop detection signal in a detection state in response to detecting the first droop in the power source voltage while the second droop detector generates a second droop detection signal in a detection state in response to detecting the second droop in the power source voltage. A frequency slowdown detection circuit generates a frequency slowdown signal in a slowdown state in response to either one of the first droop detection signal or the second droop detection signal being in the second detection state. A digitally controlled oscillator slows down a clock signal that sets the operating frequency of the processing core in response to the frequency slowdown signal being the slowdown state. By slowing down the processing core, the first and second droop in the power source voltage are ameliorated or eliminated.

Figure 1:
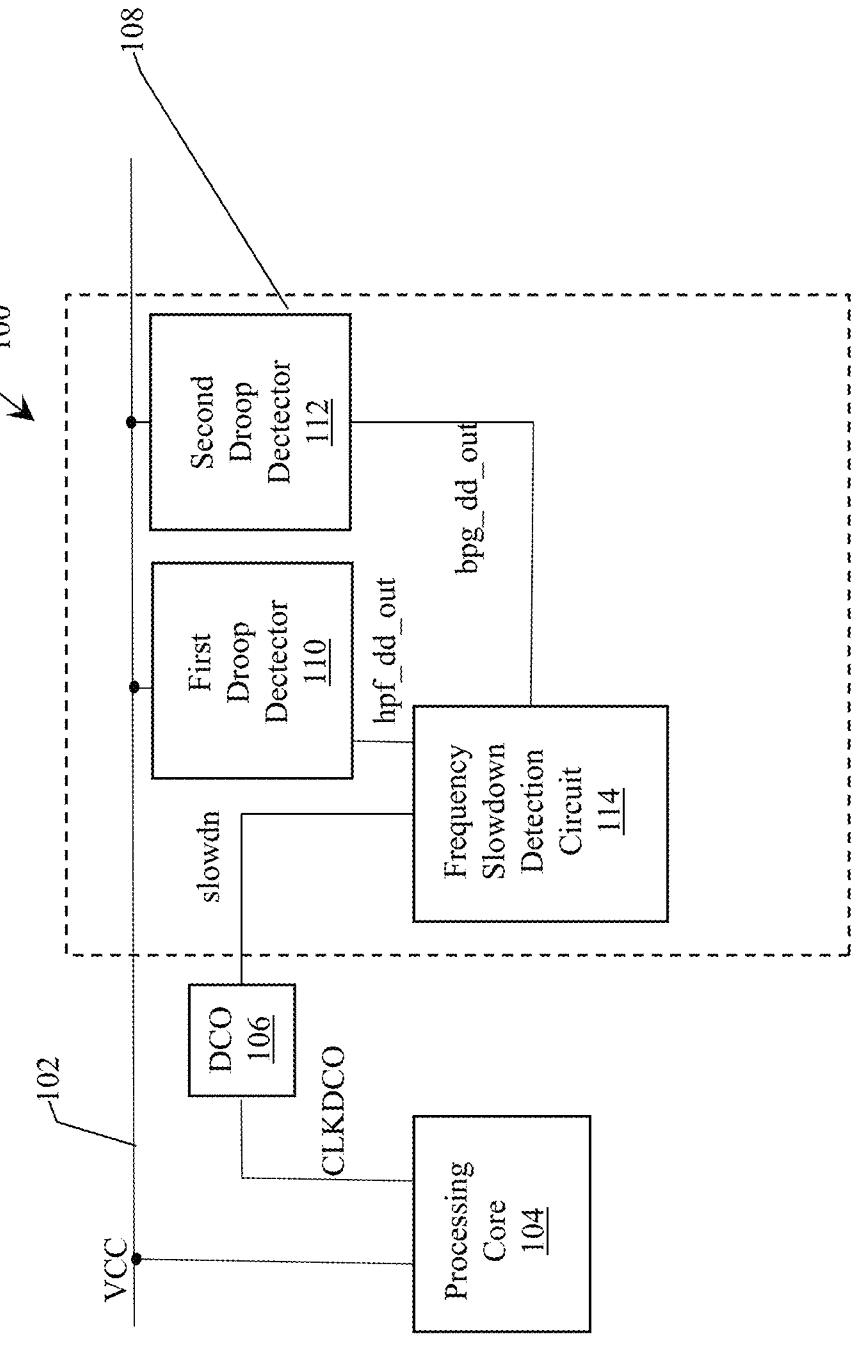
FIG. 1 is an apparatus that regulates the operation of a processing core, in accordance with some embodiments.

FIG. 1 is an apparatus 100 that regulates the operation of a processing core 104, in accordance with some embodiments.

The apparatus 100 includes a power rail 102, the processing core 104, a digitally controlled oscillator (DCO) 106, and a power regulation circuit 108. Processing core 104 may include any type of sequential state machine. In some embodiments, processing core 104 includes at least one of a microprocessor, a microcontroller, a graphics processor, a digital signal processor, or another processor. Other types of circuits that can be included in the processing core such as memory registers, a custom circuit or an application-specific integrated circuit (ASIC). In some embodiments, the processing core 104 is part of a computer system such as a cellular telephone, smart phone, pager, portable computer, two-way radios, and similar electronic system, or a communications circuit for a server.

The processing core 104 is powered by the power rail 102. The power rail 102 is configured to receive a power source voltage VCC. In some embodiments, the power source voltage VCC is directly generated by a power supply (e.g. a battery) or is a regulated power supply voltage derived from a power supply voltage generated by the power supply. The power rail 102 is a conductive metal line that is configured to carry the power source voltage VCC. Connections are formed to the power rail 102 so that circuits are powered by the power source voltage VCC.

The DCO 106 is configured to generate a core clock signal CLKDCO. The clock signal CLKDCO generates clock pulses by oscillating between high voltage states and low voltage states. The clock signal frequency is measured by the number of clock pulses of the clock signal CLKDCO within a time interval. The operating frequency of the processing core 104 is set according to the clock signal frequency of the clock signal CLKDCO.

Figure 2A:
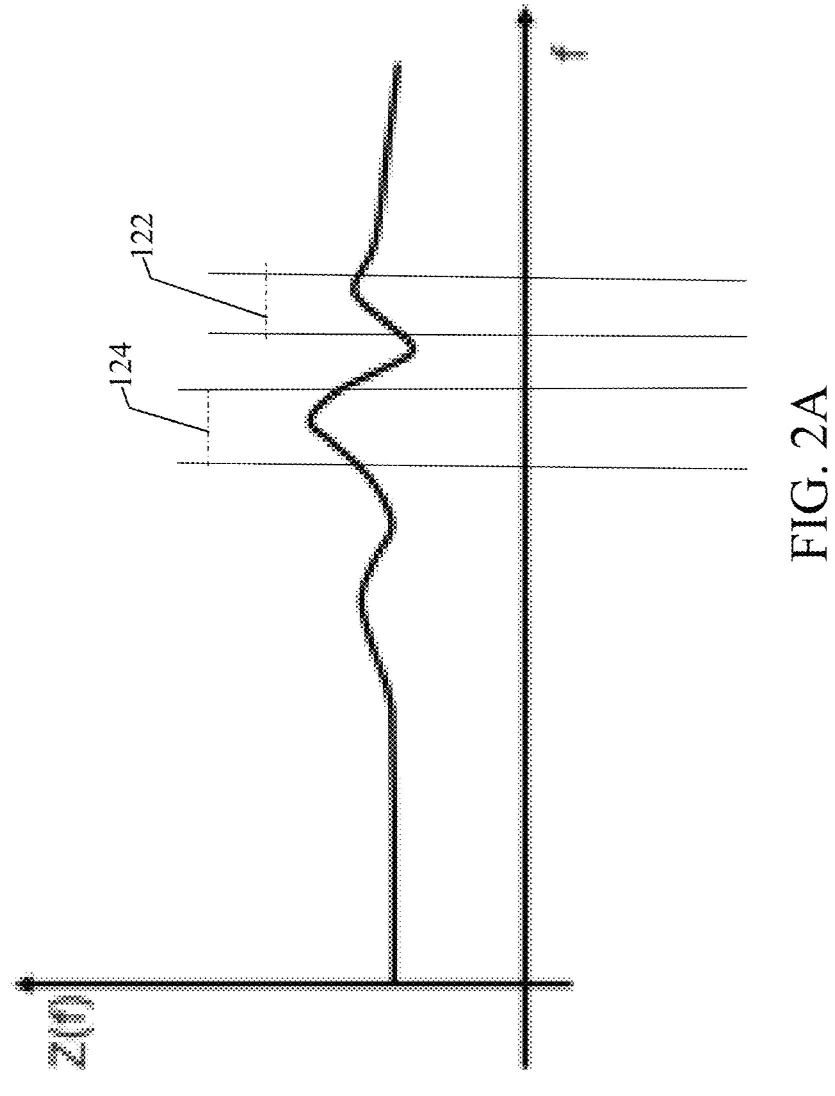
FIG. 2A illustrates an impedance as a function of frequency, where the impedance is of the processing core looking out from a power pin to a motherboard, in accordance with some embodiments.
Figure 2B:
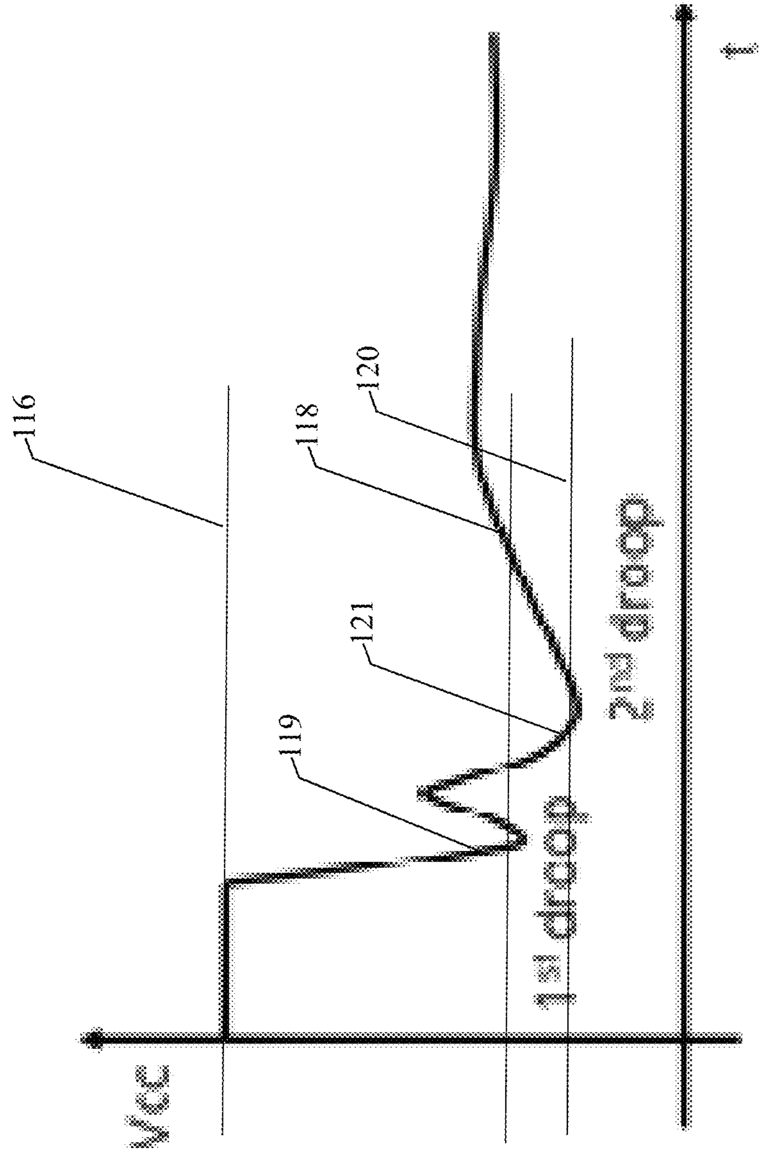
FIG. 2B is a voltage graph that illustrates a voltage level of the power source voltage VCC as a function of time when the power regulation circuit 108 is not operating, in accordance with some embodiments.

In some embodiments, the power source voltage VCC experiences droops as a result of sudden increases in current drawn from the power rail 102. FIG. 2A illustrates an impedance where the impedance is of the processing core 104 looking out from a power pin to a motherboard, as a function of frequency, in accordance with some embodiments. FIG. 2B is a voltage graph that illustrates a voltage level of the power source voltage VCC as a function of time when the power regulation circuit 108 is not operating, in accordance with some embodiments. As shown in FIG. 2B, the large increase in current drawn from the power rail 102 results in two droops 119, 121 in the voltage level of the power source voltage VCC. More specifically, the power source voltage VCC typically operates at or near a power source voltage level 116. However, due to the XXX, the voltage level of the power source drops to a first droop voltage level 118 during the first droop 119 and drops to a second droop voltage level 120 during the second droop 121. As shown in FIG. 2A, the first droop 119 is the result of an increase in the impedance in frequency band 122. The second droop 121 is the result of an increase in the impedance in the frequency band 124. In FIG. 2A, the frequency band 122 is higher in frequency than the frequency band 124. However, the increase in impedance within the frequency band 124 is greater than the increase of impedance within the frequency band 122. Thus, the drop in the voltage level of the power source voltage VCC is said to be second droop dominated. As shown, the second droop 121 occurs after the first droop 119.

Referring again to FIG. 1, to mitigate against the effects of the droops in the voltage level of the power source voltage VCC, the apparatus 100 includes the power regulation circuit 108. The power regulation circuit 108 is configured to slowdown the operating frequency of the clock signal CLKDCO. This allows the power source voltage VCC to recover and prevent or dampen the first droop 402 and the second droop 404 in the power source voltage VCC.

The power regulation circuit 108 includes a first droop detector 110, a second droop detector 112, and a frequency slowdown detection circuit 114. The first droop detector 110 and the second droop detector 112 each configured to receive the power source voltage VCC from the power rail 102. The first droop detector 110 is configured to generate a first droop detection signal hpf_dd_out in a detection state in response to detecting the first droop 119 in the power source voltage VCC. The first droop detector 110 is configured to generate the first droop detection signal hpf_dd_out in a non-detection state in response to the power source voltage VCC not having the first droop 119 and/or the power source voltage VCC being near or at the power source voltage level 116. In some embodiments, the detection state is a high voltage state (e.g., near or at VCC). In some embodiments, the non-detection state is a low voltage state (e.g., near or at ground). In other embodiments, the detection state is the low voltage state (e.g., near or at ground). In other embodiments, the non-detection state is the high voltage state (e.g., near or at ground). In some embodiments, the first droop detector 110 has a high pass filter with a high pass corner frequency that is below the lowest frequency of the frequency band 122 but above the highest frequency of the frequency band 124. In this manner, the first droop detection signal hpf_dd_out detects the first droop 119 within the frequency band 122 and, in response, generates the first droop detection signal hpf_dd_out in the detection state.

The second droop detector 112 is configured to generate a second droop detection signal bpf_dd_out in a detection state in response to detecting the second droop 121 in the power source voltage VCC. The second droop detector 112 is configured to generate the second droop detection signal bpf_dd_out in a non-detection state in response to the power source voltage VCC not having the second droop 121 and/or the power source voltage VCC being near or at the power source voltage level 116. In some embodiments, the detection state is a high voltage state (e.g., near or at VCC). In some embodiments, the non-detection state is a low voltage state (e.g., near or at ground). In other embodiments, the detection state is the low voltage state (e.g., near or at ground). In other embodiments, the non-detection state is the high voltage state (e.g., near or at ground). In some embodiments, the second droop detector 112 has a bandpass filter with a passband that that at least partially includes frequency band 124. In this manner, the second droop detection signal bpf_dd_out detects the second droop 121 within the frequency band 124 and, in response, generates the second droop detection signal bpf_dd_out in the detection state. In some embodiments, the detection state of the second droop detection signal bpf_dd_out and the detection state of the first droop detection signal hpf_dd_out is the same. In other embodiments, the detection state of the second droop detection signal bpf_dd_out and the detection state of the first droop detection signal hpf_dd_out is the different.

The frequency slowdown detection circuit 114 is configured to generate a frequency slowdown signal slowdn in a slowdown state in response to the first droop detection signal hpf_dd_out being in the detection state and/or the second droop detection signal bpf_dd_out being in the detection state. The frequency slowdown detection circuit 114 is configured to generate a frequency slowdown signal slowdn in a normal state in response to the first droop detection signal hpf_dd_out being in the non-detection state and the second droop detection signal bpf_dd_out being in the non-detection state. The DCO 106 is configured to generate the clock signal CLKDCO at the normal clock frequency in response to the frequency slowdown signal slowdn being in the normal state. However, the DCO 106 is configured to generate slow down the clock frequency of the clock signal CLKDCO in response to the frequency slowdown signal slowdn being in the slowdown state. In some embodiments, another signal (see Δf in FIG. 3 as an example) is received by the frequency slowdown detection circuit 114 to indicate the amount that the clock frequency of the clock signal CLKDCO is to be slowed down. In some embodiments, a signal level (e.g., voltage level or current level) of the slowdown signal slowdn is set to indicate either a change in the value of the clock frequency or a new value of the clock frequency. In other embodiments, the DCO 106 stops generating the clock signal CLKDCO and sets the clock signal CLKDCO in the low voltage state as long as the frequency slowdown signal slowdn is in the slowdown state. As such, the clock signal CLKDCO produces no clock pulses in this case and thereby the clock frequency is slowed. In turn, this allows the power source voltage VCC to recover and prevents or mitigates the first droop 119 and/or the second droop 121.

Figure 3:
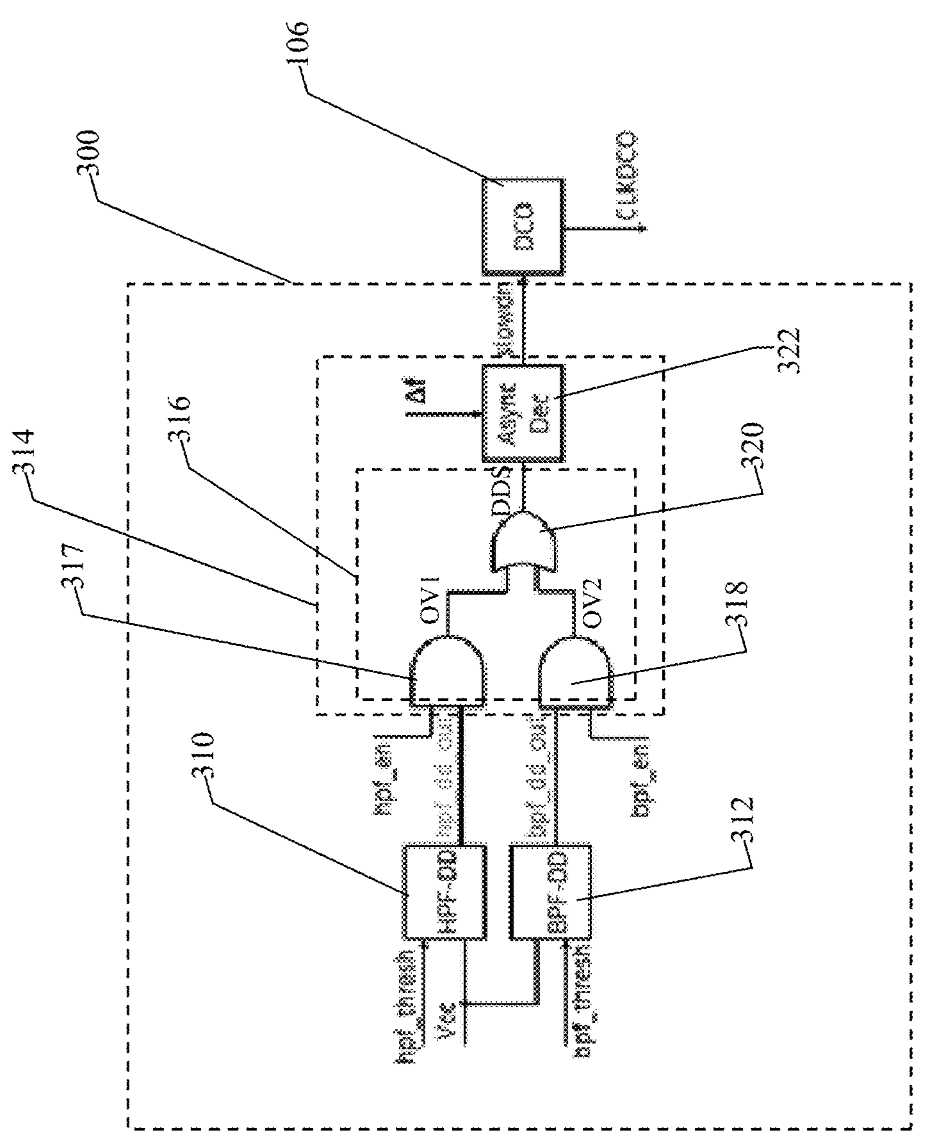
FIG. 3 is a power regulation circuit that regulates the operation of a digitally controlled oscillator (DCO), in accordance with some embodiments.

FIG. 3 is a power regulation circuit 300 that regulates the operation of the DCO 106, in accordance with some embodiments.

The power regulation circuit 300 is an example of the power regulation circuit 108 shown in FIG. 1, in accordance with some embodiments.

The power regulation circuit 300 includes a first droop detector 310, a second droop detector 312, and a frequency slowdown detection circuit 314. The first droop detector 310 is an example of the first droop detector 110 in FIG. 1, in accordance with some embodiments. The second droop detector 312 is an example of the second droop detector 112 in FIG. 1, in accordance with some embodiments. The frequency slowdown detection circuit 314 is an example of the frequency slowdown detection circuit 114 in FIG. 1, in accordance with some embodiments.

In FIG. 3, the first droop detector 310 is configured to receive the power source voltage VCC and a threshold voltage hpf_thresh. The threshold voltage hpf_thresh has a threshold voltage level. In some embodiments, the threshold voltage hpf_thresh is a DC voltage hpf_thresh where the threshold voltage level is a DC voltage level. The threshold voltage operates as a reference voltage. The first droop detector 310 includes a high pass filter in some embodiments. The high pass filter has a corner frequency that is below or within the frequency band of the first droop but above the highest frequency of the second droop.

The first droop detector 310 is configured to generate the droop detection signal hpf_dd_out. In response the first droop not being present or the first droop being lower than the threshold voltage level of the threshold voltage hpf_thresh, the first droop detector 310 is configured to generate the droop detection signal hpf_dd_out in a non-detection state. In response to the high pass filter filtering out the first droop and the first droop being lower than the threshold voltage level of the threshold voltage hpf_thresh, the first droop detector 310 is configured to generate the droop detection signal hpf_dd_out in a detection state.

In FIG. 3, the second droop detector 312 is configured to receive the power source voltage VCC and a threshold voltage bpf_thresh. The threshold voltage bpf_thresh has a threshold voltage level. In some embodiments, the threshold voltage bpf_thresh is a DC voltage where the threshold voltage level is a DC voltage level. The threshold voltage bpf_thresh operates as a reference voltage. The second droop detector 312 includes a bandpass filter in some embodiments. The bandpass filter has a passband that is at least partially within frequency band of the second droop.

The second droop detector 312 is configured to generate the droop detection signal bpf_dd_out. In response the second droop not being present or the second droop being lower than the threshold voltage level of the threshold voltage bpf_thresh, the second droop detector 312 is configured to generate the droop detection signal bpf_dd_out in a non-detection state. In response to the bandpass filter filtering out the second droop and the second droop being lower than the threshold voltage level of the threshold voltage bpf_thresh, the second droop detector 312 is configured to generate the droop detection signal bpf_dd_out in a detection state.

The frequency slowdown detection circuit 314 includes combinational logic 316 and an asynchronous detector 322. The combinational logic 316 is configured to receive the first droop detection signal hpf_dd_out and the second droop detection signal bpf_dd_out and to generate a droop detection signal DDS in a detection state in response to at least one of the first droop detection signal hpf_dd_out being in the detection state and the second droop detection signal bpf_dd_out being in the detection state. In FIG. 3, the frequency slowdown detection circuit 314 includes an AND gate 317, an AND gate 318, and an OR gate 320.

In FIG. 3, the AND gate 317 is configured to receive the detection signal hpf_dd_out and an enable signal hpf_en. In this example, the detection state of the detection signal hpf_dd_out is a high voltage state and an enable state of the enable signal hpf_en is a high voltage state. The non-detection state of the detection signal hpf_dd_out is a low voltage state and an enable state of the enable signal hpf_en is a low voltage state. In response to the detection signal hpf_dd_out being in a high voltage state and the enable signal hpf_en being in a high voltage state, the AND gate 317 is configured to output an output voltage OV1 in a high voltage state. In response to either or both the detection signal hpf_dd_out being in a low voltage state and the enable signal hpf_en being in a low voltage state, the AND gate 317 is configured to output the output voltage OV1 in a low voltage state.

In FIG. 3, the AND gate 317 is configured to receive the detection signal hpf_dd_out and an enable signal hpf_en. In this example, the detection state of the detection signal hpf_dd_out is a high voltage state and an enable state of the enable signal hpf_en is a high voltage state. The non-detection state of the detection signal hpf_dd_out is a low voltage state and an enable state of the enable signal hpf_en is a low voltage state. In response to the detection signal hpf_dd_out being in a high voltage state and the enable signal hpf_en being in a high voltage state, the AND gate 317 is configured to output an output voltage OV1 in a high voltage state. In response to either or both the detection signal hpf_dd_out being in a low voltage state and the enable signal hpf_en being in a low voltage state, the AND gate 317 is configured to output the output voltage OV1 in a low voltage state.

In FIG. 3, the AND gate 318 is configured to receive the detection signal bpf_dd_out and an enable signal bpf_en. In this example, the detection state of the detection signal bpf_dd_out is a high voltage state and an enable state of the enable signal bpf_en is a high voltage state. The non-detection state of the detection signal bpf_dd_out is a low voltage state and an enable state of the enable signal bpf_en is a low voltage state. In response to the detection signal bpf_dd_out being in a high voltage state and the enable signal bpf_en being in a high voltage state, the AND gate 317 is configured to output an output voltage OV2 in a high voltage state. In response to either or both the detection signal bpf_dd_out being in a low voltage state and the enable signal bpf_en being in a low voltage state, the AND gate 317 is configured to output the output voltage OV2 in a low voltage state.

In response to both the output voltage OV1 and the output voltage OV2 is in a low voltage state, the OR gate 320 is configured to generate the droop detection signal DDS in a non-detection state, which in this example is a low voltage state. In response to either or both the output voltage OV1 and the output voltage OV2 is in a high voltage state, the OR gate 320 is configured to generate the droop detection signal DDS in a detection state, which in this example is a high voltage state.

An asynchronous detector 322 is configured to generate the frequency slowdown signal slowdn in the slowdown state in response to the droop detection signal DDS being in the detection state. The asynchronous detector 322 is configured to generate the frequency slowdown signal slowdn in the normal state in response to the droop detection signal DDS being in the non-detection state. In some embodiments, a signal Δf indicates an amount of change in the clock frequency. A signal level of the slowdown signal slowdn is adjusted in order to indicate either the amount of change in the clock frequency or a new value of the clock frequency.

The slowdown signal slowdn is transmitted to the DCO 106, which operates with respect to the slowdown signal slowdn as described in FIG. 1.

Figure 4A:
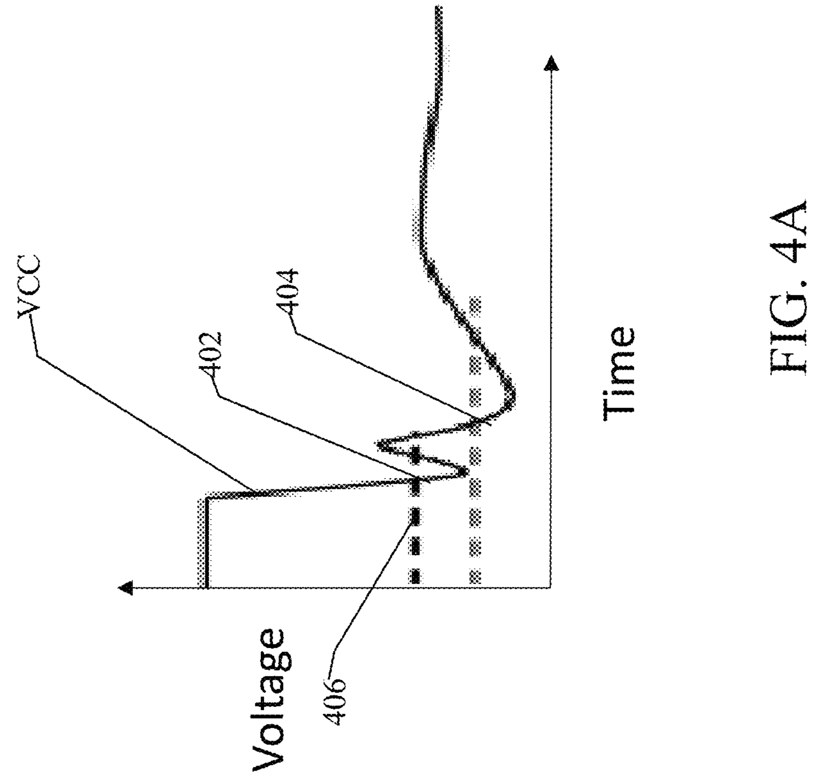
FIG. 4A is a voltage graph that illustrates the power source voltage as a function of time, in accordance with some embodiments.

FIG. 4A is a voltage graph that illustrates the power source voltage VCC as a function of time, in accordance with some embodiments.

In some embodiments, the power source voltage VCC is the power source voltage when the power regulation circuit 300 is not enabled. A DC threshold voltage level 406 of the threshold voltage hpf_thresh is set so that when the power source voltage VCC is equal to or below the DC threshold voltage level 406, the first droop 402 is detected. A DC threshold voltage level 408 of the threshold voltage bpf_thresh is set so that when the power source voltage VCC is equal to or below the DC threshold voltage level 408, the second droop 404 is detected.

Figure 4B:
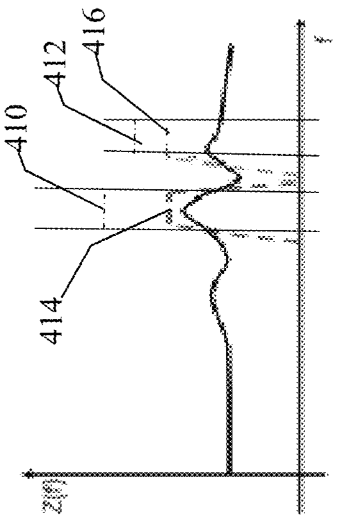
FIG. 4B is an impedance graph that illustrates the impedance as a function of frequency, in accordance with some embodiments.

FIG. 4B is a impedance graph that illustrates the impedance Z(f) as a function of frequency, in accordance with some embodiments.

The second droop 404 is the result of an increase in the impedance Z(f) within the frequency range 410 and the first droop 402 is the result of the increase in the impedance Z(f) within the frequency range 412. The passband 414 of a bandpass filter in the second droop detector 312 (See FIG. 3) is within the frequency range 410 to filter the second droop 404. The high pass band 416 of a high pass filter in the first droop detector 310 (See FIG. 3) is within the frequency range 412 to filter the first droop 402.

Figure 4C:
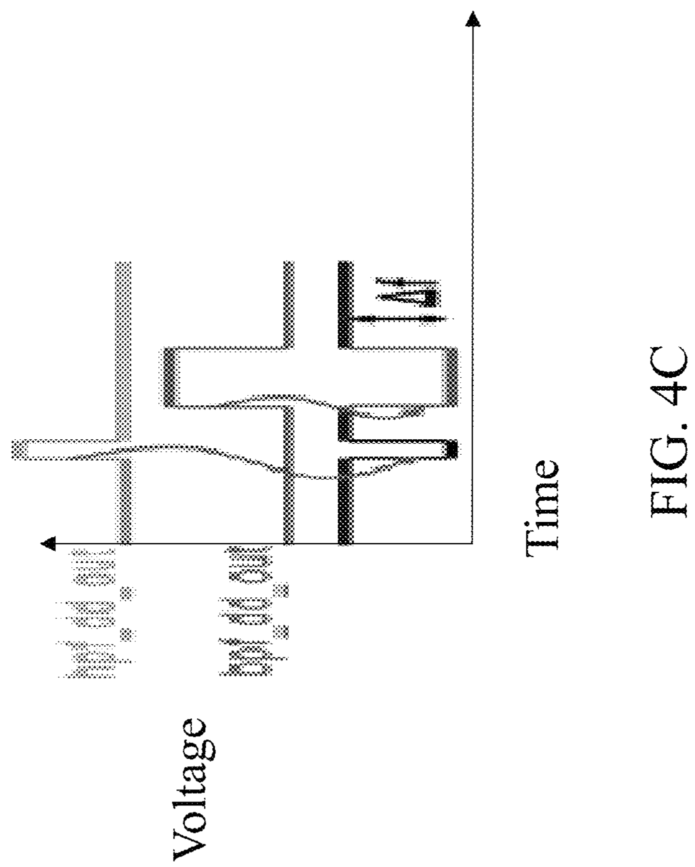
FIG. 4C is a voltage graph that illustrates the detection signal, the detection signal, and the slowdown signal as a function of time, in accordance with some embodiments.

FIG. 4C is a voltage graph that illustrates the detection signal hpf_dd_out, the detection signal bpf_dd_out, and the slowdown signal as a function of time, in accordance with some embodiments.

In response to the first droop detector 310 detecting the first droop 402, the detection signal hpf_dd_out goes from a low voltage state to a high voltage state. As a result, the asynchronous detector 322 causes the slowdown signal slowdn to go from a high voltage state to a low voltage state. This causes the DCO 106 to stop generating pulses in the clock signal CLKDCO in response to the slowdown signal slowdn being in the low voltage state.

In response to the second droop detector 312 detecting the second droop 404, the detection signal bpf_dd_out goes from a low voltage state to a high voltage state. As a result, the asynchronous detector 322 causes the slowdown signal slowdn to go from a high voltage state to a low voltage state. This causes the DCO 106 to stop generating pulses in the clock signal CLKDCO in response to the slowdown signal slowdn being in the low voltage state.

FIG. 5A-5E are bandpass filters 500A-500E that may be included in the second droop detector 312 shown in FIG. 3, in accordance with some embodiments.

Each of the bandpass filters 500A-500E includes an input terminal IN that receives the power source voltage VCC and an output terminal OUT that outputs the second droop 404 when present in the power source voltage VCC.

Figure 5A:
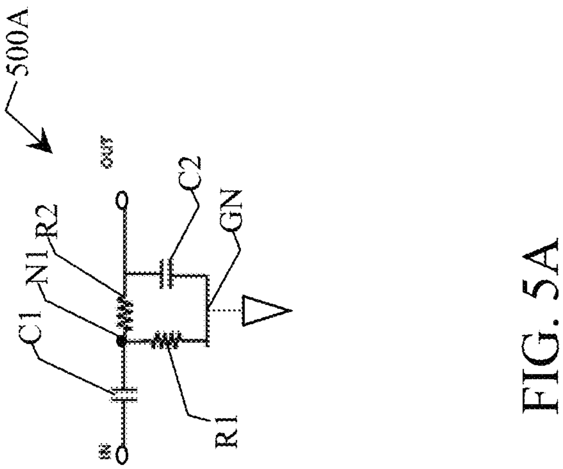
FIG. 5A-5E are bandpass filters that may be included in the second droop detector shown in FIG. 3, in accordance with some embodiments.

The bandpass filter 500A in FIG. 5A is a passive bandpass filter. The bandpass filter 500A includes capacitors C1, C2 and resistors R1, R2. Capacitor C1 is connected between the input terminal IN and a node N1. The resistor R1 is connected between the node N1 and a ground node GN. The ground node GN is configured to receive a ground voltage. The resistor R2 is connected between the node N1 and the output terminal OUT. The capacitor C2 is connected between the output terminal OUT and the ground node GN.

Figure 5B:
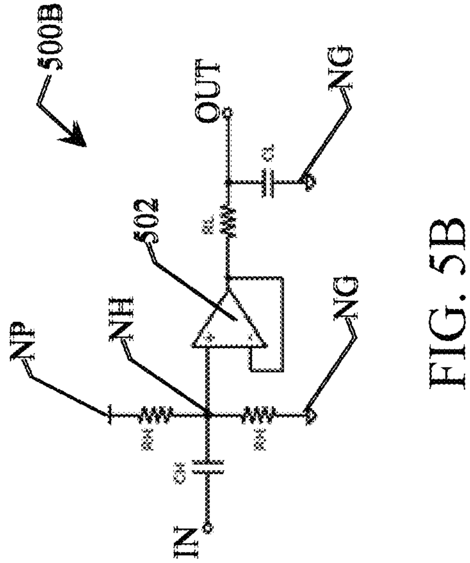

The bandpass filter 500B in FIG. 5B is a unity gain high pass low pass filter. The bandpass filter 500B includes a capacitor CH, two resistors RH, an operational amplifier 502, a resistor RL, and a capacitor CL. The capacitor CH is connected between the input terminal IN and a node NH. The node NH is connected directly to a non-inverting terminal of the operational amplifier 502. One of the resistors RH is connected between a power source terminal NP and the node NH. The other resistor RH is connected between the node NH and the ground node NG. The resistor RL is connected between the output terminal of the operational amplifier 502 and the output terminal OUT. The output terminal of the operational amplifier 502 is directly connected to the inverting terminal of the operational amplifier 502. The capacitor CL is connected between the output terminal OUT and the ground node NG.

Figure 5C:
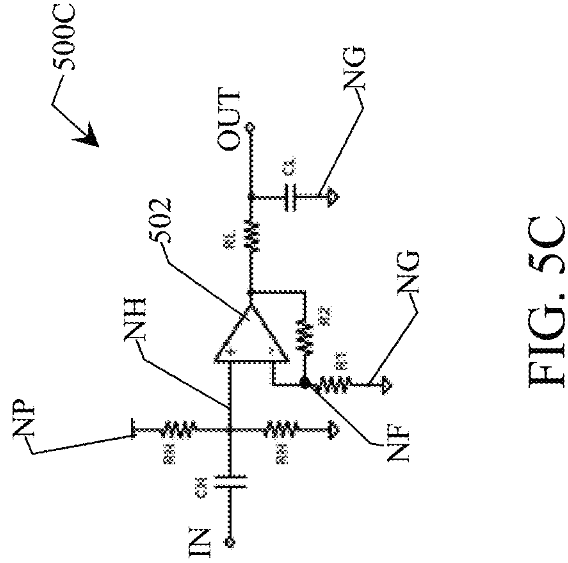

The bandpass filter 500C in FIG. 5C is a non-unity gain high pass low pass filter. The bandpass filter 500C in FIG. 5C is the same as the bandpass filter 500B, except that the output terminal of the operational amplifier 502 is not directly connected to the non-inverting terminal of the operational amplifier 502. Instead, the bandpass filter 500C includes a resistor R1 and a resistor R2. The resistor R2 is connected between the output terminal of the operational amplifier 502 and a node NF. The node NF is connected directly to the non-inverting terminal of the operational amplifier 502. The resistor R1 is connected between the node NF and the ground node NG.

Figure 5D:
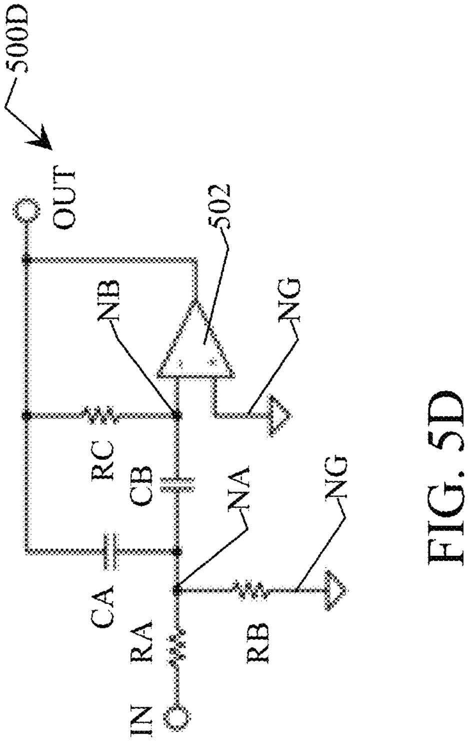

The bandpass filter 500D in FIG. 5D is a multi-feedback bandpass filter. The bandpass filter 500D includes, a resistor RA, a resistor RB, a resistor RC, a capacitor CA, a capacitor CB, and the operational amplifier 502. The resistor RA is connected between the input terminal IN and a node NA. The resistor RB is connected between the node NA and the ground node NG. A capacitor CA is connected between the output terminal OUT and the node NA. A resistor RC is connected between the output terminal OUT and a node NB. A capacitor CB is connected between the node NA and the node NB. The inverting terminal of the operation amplifier 502 is directly connected to the node NB. The non-inverting terminal of the operational amplifier 502 is directly connected to the ground node NG. The output terminal of the operational amplifier 502 is directly connected to the output terminal OUT.

Figure 5E:
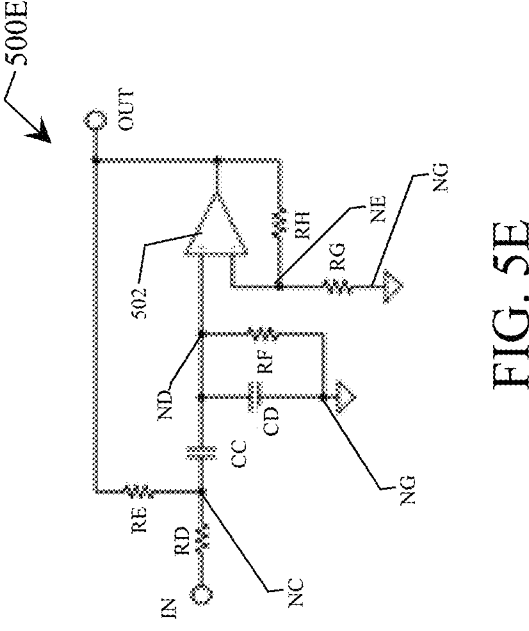

The bandpass filter 500E in FIG. 5E is a Sallen-Key bandpass filter. The bandpass filter 500A includes capacitors CC, CD and resistors RD, RE, RF, RH. Resistor RD is connected between the input terminal IN and a node NC. A resistor RE is connected between the output terminal OUT and the node NC. A capacitor is the node NC and a node ND. A capacitor CD is connected between the node ND and the ground node NG. A resistor RF is connected between the node ND and the ground node NG. The node ND is directly connected is directly connected to the non-inverting terminal of the operational amplifier 502. The output terminal of the operational amplifier 502 is directly connected to the output terminal OUT. A resistor RH is connected between the output terminal of the operational amplifier 502 and a node NE. A resistor RG is connected between the node NE and the ground node NG. The inverting terminal of the operational amplifier 502 is directly connected to the node NE.

Figure 6:
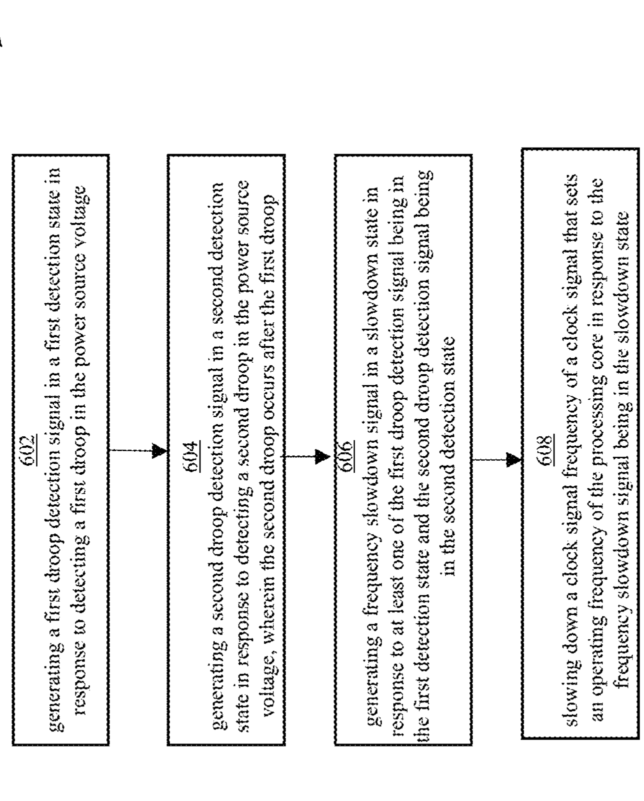
FIG. 6 is a block diagram that illustrates an exemplary method of regulating a power source voltage that powers a processing core, in accordance with some embodiments.

FIG. 6 is a block diagram 600 that illustrates an exemplary method of regulating a power source voltage that powers a processing core, in accordance with some embodiments.

The block diagram 600 includes blocks 602-608. In some embodiments, blocks 602-608 are performed by the power regulation circuit 108 in FIG. 1 or the power regulation circuit 300 in FIG. 3. In some embodiments, the processing core is the processing core 104 of FIG. 1. Flow begins at block 602.

At block 602, a first droop detection signal is generated in a first detection state in response to detecting a first droop in the power source voltage. In some embodiments, the first droop detection signal is the detection signal hpf_dd_out shown in FIG. 1 and FIG. 3. In some embodiments, block 602 is performed by the first droop detector 110 in FIG. 1 or the first droop detector 310 in FIG. 3. Flow then proceeds to block 604.

At block 604, a second droop detection signal is generated in a second detection state in response to detecting a second droop in the power source voltage, wherein the second droop occurs after the first droop. In some embodiments, the second droop detection signal is the detection signal bpf_dd_out shown in FIG. 1 and FIG. 3. In some embodiments, block 604 is performed by the second droop detector 112 in FIG. 1 or the second droop detector 312 in FIG. 3. Flow then proceeds to block 606.

At block 606, a frequency slowdown signal in a slowdown state in response to at least one of the first droop detection signal being in the first detection state and the second droop detection signal being in the second detection state. In some embodiments, the frequency slowdown signal is the slowdown signal slowdn shown in FIG. 1 and FIG. 3. In some embodiments, block 606 is performed by the frequency slowdown detection circuit 114 in FIG. 1 or the frequency slowdown detection circuit 314 in FIG. 3. Flow then proceeds to block 608.

At block 608, a clock signal frequency of a clock signal that sets an operating frequency of the processing core is slowed down in response to the frequency slowdown signal being in the slowdown state. In some embodiments, block 608 is performed by the DCO 106 is FIG. 1 or FIG. 3.

Figure 7:
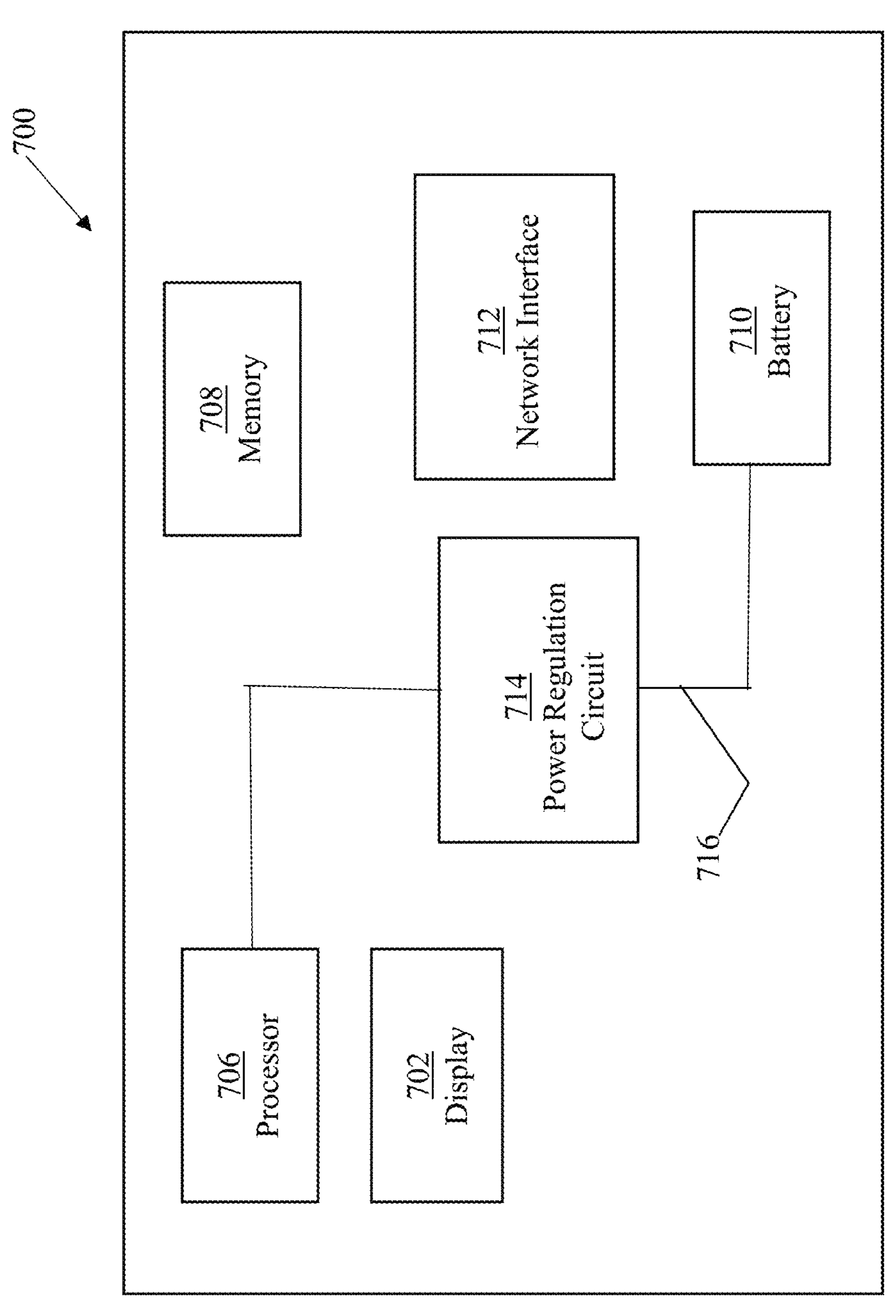
FIG. 7 is an electronic device 700, in accordance with some embodiments.

FIG. 7 is an electronic device 700, in accordance with some embodiments.

A display 702 may also have glass layers and other layers, circuitry, and so forth. The display 702 may be a micro-LED display panel.

The electronic device 700 may be a mobile device such as smartphone, tablet, notebook, smartwatch, and so forth. The electronic device 700 may be a computing device, stand-alone display, television, display monitor, vehicle computer display, and/or the like. Indeed, the electronic device 700 may generally be any electronic device having a display or display panel.

The electronic device 700 may include a processor 706 (e.g., a central processing unit or CPU) and memory 708. The memory 708 may include volatile memory and non-volatile memory. The processor 706 or other controller, along with executable code store in the memory 708, may provide for touchscreen control of the display and well as for other features and actions of the electronic device 700.

In addition, the electronic device 700 may include a battery 710 that powers the electronic device including the display panel 702 and the processor 706. In some embodiments, the processor 706 is an example of the processing core 104 shown in FIG. 1. The electronic device 700 may also include a network interface 712 to provide for wired or wireless coupling of the electronic to a network or the internet. Wireless protocols may include Wi-Fi (e.g., via an access point or AP), Wireless Direct®, Bluetooth®, and the like. Lastly, as is apparent, the electronic device 700 may include additional components including circuitry and other components.

The device 700 includes a power regulation circuit 714. Power regulation circuit 100 and 300 in FIG. 3 are examples of the power regulation circuit 714, in accordance with some embodiments. The battery 710 generates a power source voltage along a power rail 716. In some embodiments, the power rail 716 is an example of the power rail 102 in FIG. 1. The power regulation circuit 714 prevents or ameliorates a first and second droop in the power source voltage on the power rail 716.

EXAMPLES

Some non-limiting examples of various embodiments are provided below.

Example 1 is a power regulation circuit for a power source voltage that powers a processing core, the power regulation circuit comprising: a first droop detector to generate a first droop detection signal in a first detection state in response to detecting a first droop in the power source voltage; a second droop detector to generate a second droop detection signal in a second detection state in response to detecting a second droop in the power source voltage, wherein the second droop occurs after the first droop; a frequency slowdown detection circuit to generate a frequency slowdown signal in a slowdown state in response to at least one of the first droop detection signal being in the first detection state and the second droop detection signal being in the second detection state.

Example 2 is the power regulation circuit of example 1, wherein the frequency slowdown detection circuit is coupled to a digitally controlled oscillator (DCO), wherein the DCO is to: generate a core clock signal having a clock signal frequency that sets an operating frequency of the processing core; slowdown the clock signal frequency in response to the frequency slowdown signal being in the slowdown state.

Example 3 is the power regulation circuit of example 1, wherein: the second droop detector to receive a first threshold voltage having a first threshold voltage level; the second droop detector comprises a bandpass filter having a passband that is at least partially aligned with a frequency range of the second droop; the second droop detector to generate the second droop detection signal in the second detection state in response to the bandpass filter filtering the second droop such that the second droop is lower than the first threshold voltage level of the first threshold voltage.

Example 4 is the power regulation circuit of example 3, wherein: the first droop detector to receive a second threshold voltage having a second threshold voltage level; the first droop detector comprises a highpass filter having a high band that includes a frequency range of the first droop; the first droop detector to generate the first droop detection signal in the first detection state in response to the highpass filter filtering the first droop such that the first droop is lower than the second threshold voltage level of the second threshold voltage.

Example 5 is the power regulation circuit of example 1, wherein the frequency slowdown detection circuit comprises: combination logic to receive the first droop detection signal and the second droop detection signal and to generate a droop detection signal in a third detection state in response to at least one of the first droop detection signal being in the first detection state and the second droop detection signal being in the second detection state; an asynchronous detector to generate the frequency slowdown signal in the slowdown state in response to the droop detection signal being in the third detection state.

Example 6 is the power regulation circuit of example 5, wherein the first detection state, the second detection state, and the third detection state are a same voltage state.

Example 7 is the power regulation circuit of example 1, wherein the power source voltage is received from a power rail.

Example 8 is an apparatus, comprising: a power rail configured to receive a power source voltage; a processing core that is powered by the power source voltage; a digitally controlled oscillator (DCO) to generate a core clock signal having a clock signal frequency that sets an operating frequency of the processing core; a power regulation circuit, comprising: a first droop detector to generate a first droop detection signal in a first detection state in response to detecting a first droop in the power source voltage; a second droop detector to generate a second droop detection signal in a second detection state in response to detecting a second droop in the power source voltage, wherein the second droop occurs after the first droop; a frequency slowdown detection circuit to generate a frequency slowdown signal in a slowdown state in response to at least one of the first droop detection signal being in the first detection state and the second droop detection signal being in the second detection state, wherein the DCO is to slowdown the clock signal frequency in response to the frequency slowdown signal being in the slowdown state.

Example 9 is the apparatus of example 8, wherein: the second droop detector to receive a first threshold voltage having a first threshold voltage level; the second droop detector comprises a bandpass filter having a passband that is at least partially aligned with a frequency range of the second droop; the second droop detector to generate the second droop detection signal in the second detection state in response to the passband filtering the second droop such that the second droop is lower than the first threshold voltage level of the first threshold voltage.

Example 10 is the apparatus of example 9, wherein: the first droop detector to receive a second threshold voltage having a second threshold voltage level; the first droop detector comprises a highpass filter having a high band that includes a frequency range of the first droop; the first droop detector to generate the first droop detection signal in the first detection state in response to the high band filtering the first droop such that the first droop is lower than the second threshold voltage level of the second threshold voltage.

Example 11 is the apparatus of example 8, wherein the power source voltage is generated by a battery.

Example 12 is the apparatus of example 8, wherein the frequency slowdown detection circuit comprises: combination logic to receive the first droop detection signal and the second droop detection signal and to generate a droop detection signal in a third detection state in response to at least one of the first droop detection signal being in the first detection state and the second droop detection signal being in the second detection state; an asynchronous detector to generate the frequency slowdown signal in the slowdown state in response to the droop detection signal being in the third detection state.

Example 13 is the apparatus of example 12, wherein the first detection state, the second detection state, and the third detection state are a same voltage state.

Example 14 is a power regulation circuit for a power source voltage that powers a processing core, the power regulation circuit comprising: a first droop detector to filter a high band so as to filter a first droop in a power source voltage and generate a first droop detection signal in a first detection state in response to detecting the first droop; a second droop detector to filter a passband to generate a second droop detection signal in a second detection state in response to detecting the second droop in the power source voltage, wherein the second droop occurs after the first droop; a frequency slowdown detection circuit to generate a frequency slowdown signal in a slowdown state in response to at least one of the first droop detection signal being in the first detection state and the second droop detection signal being in the second detection state.

Example 15 is the power regulation circuit of example 14, wherein the frequency slowdown detection circuit is coupled to a digitally controlled oscillator (DCO), wherein the DCO is to: generate a core clock signal having a clock signal frequency that sets an operating frequency of the processing core; slowdown the clock signal frequency in response to the frequency slowdown signal being in the slowdown state.

Example 16 is the power regulation circuit of example 14, wherein: the second droop detector to receive a first threshold voltage having a first threshold voltage level; the second droop detector comprises a bandpass filter having the passband that is at least partially aligned with a frequency range of the second droop; the second droop detector to generate the second droop detection signal in the second detection state in response to the bandpass filter filtering the second droop such that the second droop is lower than the first threshold voltage level of the first threshold voltage.

Example 17 is the power regulation circuit of example 16, wherein: the first droop detector to receive a second threshold voltage having a second threshold voltage level; the first droop detector comprises a highpass filter having the high band that includes a frequency range of the first droop; the first droop detector to generate the first droop detection signal in the first detection state in response to the highpass filter filtering the first droop such that the first droop is lower than the second threshold voltage level of the second threshold voltage.

Example 18 is the power regulation circuit of example 14, wherein the frequency slowdown detection circuit comprises: combination logic to receive the first droop detection signal and the second droop detection signal and to generate a droop detection signal in a third detection state in response to at least one of the first droop detection signal being in the first detection state and the second droop detection signal being in the second detection state; an asynchronous detector to generate the frequency slowdown signal in the slowdown state in response to the droop detection signal being in the third detection state.

Example 19 is the power regulation circuit of example 18, wherein the first detection state, the second detection state, and the third detection state are a same voltage state.

Example 20 is the power regulation circuit of example 14, wherein the power source voltage is received from a power rail.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In the detailed description above, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the detailed description above is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description above may use the phrases "in an embodiment," "in some embodiments," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used above. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

What is claimed is:

1. A power regulation circuit for a power source voltage that powers a processing core, the power regulation circuit comprising:

a first droop detector to generate a first droop detection signal in a first detection state in response to detecting a first droop in the power source voltage;

a second droop detector to generate a second droop detection signal in a second detection state in response to detecting a second droop in the power source voltage, wherein the second droop occurs after the first droop;

a frequency slowdown detection circuit to generate a frequency slowdown signal in a slowdown state in response to at least one of the first droop detection signal being in the first detection state and the second droop detection signal being in the second detection state, wherein the frequency slowdown detection circuit comprises: (a) combination logic to receive the first droop detection signal and the second droop detection signal and to generate a droop detection signal in a third detection state in response to at least one of the first droop detection signal being in the first detection state and the second droop detection signal being in the second detection state, and (b) an asynchronous detector to generate the frequency slowdown signal in the slowdown state in response to the droop detection signal being in the third detection state.

2. The power regulation circuit of claim 1, wherein the frequency slowdown detection circuit is coupled to a digitally controlled oscillator (DCO), wherein the DCO is to:

generate a core clock signal having a clock signal frequency that sets an operating frequency of the processing core;

slowdown the clock signal frequency in response to the frequency slowdown signal being in the slowdown state.

3. The power regulation circuit of claim 1, wherein:

the second droop detector to receive a first threshold voltage having a first threshold voltage level;

the second droop detector comprises a bandpass filter having a passband that is at least partially aligned with a frequency range of the second droop;

the second droop detector to generate the second droop detection signal in the second detection state in response to the bandpass filter filtering the second droop such that the second droop is lower than the first threshold voltage level of the first threshold voltage.

4. The power regulation circuit of claim 3, wherein:

the first droop detector to receive a second threshold voltage having a second threshold voltage level;

the first droop detector comprises a highpass filter having a high band that includes a frequency range of the first droop;

the first droop detector to generate the first droop detection signal in the first detection state in response to the highpass filter filtering the first droop such that the first droop is lower than the second threshold voltage level of the second threshold voltage.

5. The power regulation circuit of claim 1, wherein the first detection state, the second detection state, and the third detection state are a same voltage state.

6. The power regulation circuit of claim 1, wherein the power source voltage is received from a power rail.

7. An apparatus, comprising:

a power rail configured to receive a power source voltage;

a processing core that is powered by the power source voltage;

a digitally controlled oscillator (DCO) to generate a core clock signal having a clock signal frequency that sets an operating frequency of the processing core;

a power regulation circuit, comprising:

a first droop detector to generate a first droop detection signal in a first detection state in response to detecting a first droop in the power source voltage, wherein the first droop detector comprises a high pass filter having a high band that includes a frequency range of the first droop;

a second droop detector to generate a second droop detection signal in a second detection state in response to detecting a second droop in the power source voltage, wherein the second droop occurs after the first droop; and a frequency slowdown detection circuit to generate a frequency slowdown signal in a slowdown state in response to at least one of the first droop detection signal being in the first detection state and the second droop detection signal being in the second detection state, wherein the DCO is to slowdown the clock signal frequency in response to the frequency slowdown signal being in the slowdown state.

8. The apparatus of claim 7, wherein:

the second droop detector to receive a first threshold voltage having a first threshold voltage level;

the second droop detector comprises a bandpass filter having a passband that is at least partially aligned with a frequency range of the second droop;

the second droop detector to generate the second droop detection signal in the second detection state in response to the passband filtering the second droop such that the second droop is lower than the first threshold voltage level of the first threshold voltage.

9. The apparatus of claim 7, wherein the power source voltage is generated by a battery.

10. The apparatus of claim 7, wherein the frequency slowdown detection circuit comprises:

combination logic to receive the first droop detection signal and the second droop detection signal and to generate a droop detection signal in a third detection state in response to at least one of the first droop detection signal being in the first detection state and the second droop detection signal being in the second detection state;

an asynchronous detector to generate the frequency slowdown signal in the slowdown state in response to the droop detection signal being in the third detection state.

11. The apparatus of claim 10, wherein the first detection state, the second detection state, and the third detection state are a same voltage state.

12. A power regulation circuit for a power source voltage that powers a processing core, the power regulation circuit comprising:

a first droop detector to pass a high band so as to detect a first droop in a power source voltage and generate a first droop detection signal in a first detection state in response to detecting the first droop;

a second droop detector to pass a passband to generate a second droop detection signal in a second detection state in response to detecting the second droop in the power source voltage, wherein the second droop occurs after the first droop; and a frequency slowdown detection circuit to generate a frequency slowdown signal in a slowdown state in response to at least one of the first droop detection signal being in the first detection state and the second droop detection signal being in the second detection state.

13. The power regulation circuit of claim 12, wherein the frequency slowdown detection circuit is coupled to a digitally controlled oscillator (DCO), wherein the DCO is to:

generate a core clock signal having a clock signal frequency that sets an operating frequency of the processing core;

slowdown the clock signal frequency in response to the frequency slowdown signal being in the slowdown state.

14. The power regulation circuit of claim 12, wherein:

the second droop detector to receive a first threshold voltage having a first threshold voltage level;

the second droop detector comprises a bandpass filter having the passband that is at least partially aligned with a frequency range of the second droop;

the second droop detector to generate the second droop detection signal in the second detection state in response to the bandpass filter filtering the second droop such that the second droop is lower than the first threshold voltage level of the first threshold voltage.

15. The power regulation circuit of claim 14, wherein:

the first droop detector to receive a second threshold voltage having a second threshold voltage level;

the first droop detector comprises a highpass filter having the high band that includes a frequency range of the first droop;

the first droop detector to generate the first droop detection signal in the first detection state in response to the highpass filter filtering the first droop such that the first droop is lower than the second threshold voltage level of the second threshold voltage.

16. The power regulation circuit of claim 12, wherein the frequency slowdown detection circuit comprises:

combination logic to receive the first droop detection signal and the second droop detection signal and to generate a droop detection signal in a third detection state in response to at least one of the first droop detection signal being in the first detection state and the second droop detection signal being in the second detection state;

an asynchronous detector to generate the frequency slowdown signal in the slowdown state in response to the droop detection signal being in the third detection state.

17. The power regulation circuit of claim 16, wherein the first detection state, the second detection state, and the third detection state are a same voltage state.

18. The power regulation circuit of claim 12, wherein the power source voltage is received from a power rail.

* * * * *